United States Patent [19]

Suski et al.

[11] Patent Number: 5,414,223
[45] Date of Patent: May 9, 1995

[54] SOLDER PAD FOR PRINTED CIRCUIT BOARDS

[75] Inventors: Edward D. Suski, Lake Forest; David J. Silva, Trabuco, both of Calif.; Glenn G. Miner, Weatherford, Tex.

[73] Assignee: AST Research, Inc., Irvine, Calif.

[21] Appl. No.: 288,470

[22] Filed: Aug. 10, 1994

[51] Int. Cl.⁶ .............................................. H05K 1/02
[52] U.S. Cl. ................................... 174/262; 361/752; 361/753; 361/796; 361/801; 174/263; 174/264; 174/266; 174/261
[58] Field of Search ............... 174/262, 263, 264, 265, 174/266, 261; 361/752, 753, 796, 801, 802

[56] References Cited

U.S. PATENT DOCUMENTS

| | | | |
|---|---|---|---|
| 4,543,715 | 10/1985 | Iadarola et al. | 29/852 |
| 4,851,614 | 6/1989 | Duncan, Jr. | 174/68.5 |
| 5,326,937 | 6/1994 | Watanabe | 174/263 |

Primary Examiner—Leo P. Picard
Assistant Examiner—L. Thomas
Attorney, Agent, or Firm—Lyon & Lyon

[57] ABSTRACT

An improved omni-directional non-occluding solder pad design for printed circuit boards comprising a plurality of spokes radiating outward from a through-hole on the printed circuit board, with a ring concentric to the through-hole that intersects each of the plurality of spokes at approximately a perpendicular angle. The ringed-spoke configuration eliminates the need to ensure proper orientation of the solder pad on the printed circuit board prior to a wave soldering process since the symmetrical ringed-spoke design is omni-directional. The concentric ring structure provides an additional contact area of solder between the printed circuit board and a computer chassis. This additional contact area of solder ensures that there is a sufficient electrical connection between the printed circuit board and the computer chassis such that when the printed circuit board is mounted to the computer chassis, a proper grounding connection is provided.

14 Claims, 4 Drawing Sheets

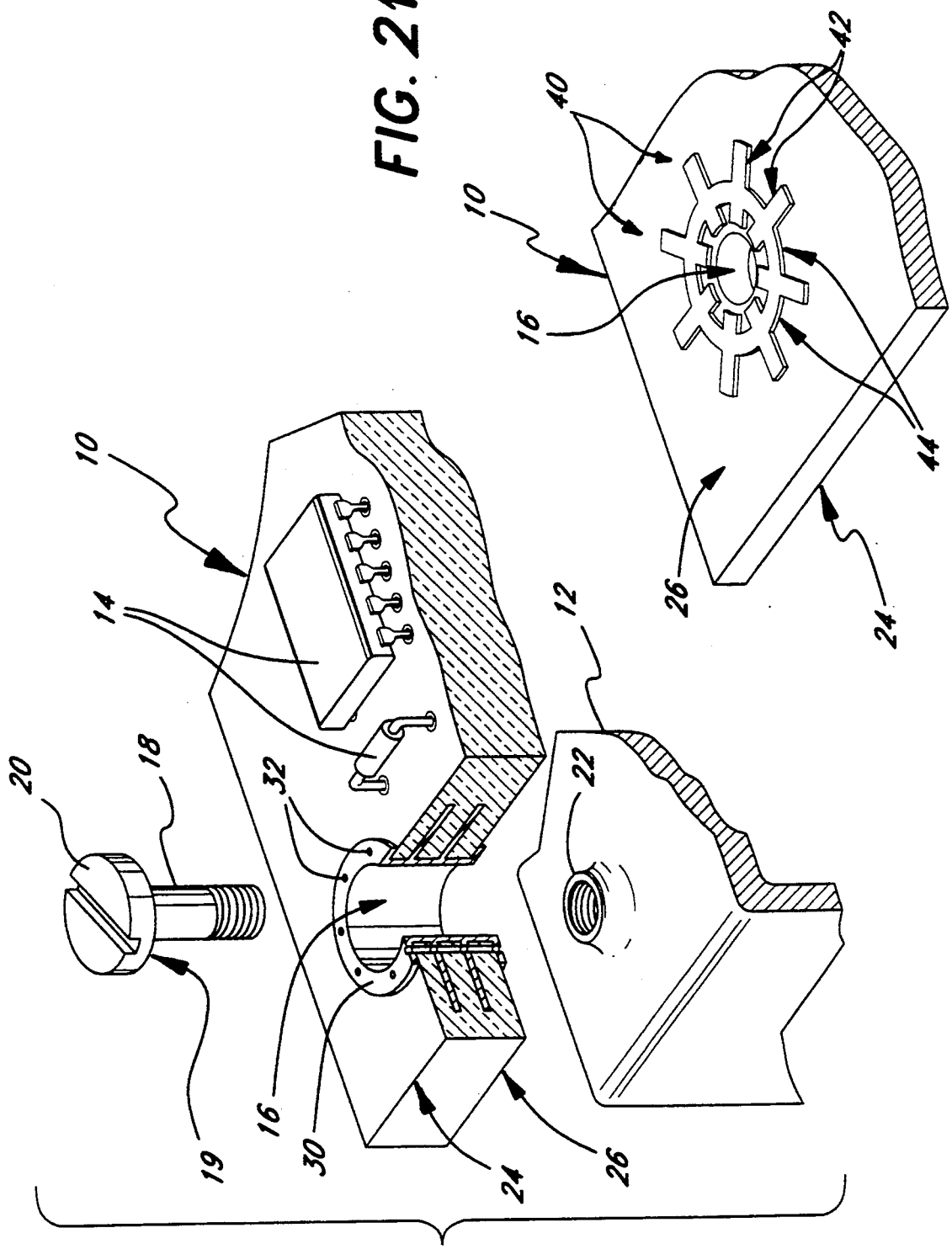

SOLDER PAD FOR PRINTED CIRCUIT BOARDS

FIELD OF THE INVENTION

This invention relates to printed circuit boards, and more specifically to a solder pad for omni-directional non-occluding through-holes on printed circuit boards.

BACKGROUND OF THE INVENTION

The use of a substantially C-shaped solder pad, with plated via holes for providing an electrical connection between various layers of a printed circuit board, wherein the C-shaped solder pad partially surrounds a non-plated through-hole which is resistant to solder occlusion upon wave soldering is known in the art and is disclosed in U.S. Pat. No. 4,851,614 ('614 patent), which is incorporated herein by reference. The use of a spoked solder pad is also known in the art.

Although these prior art solder pad designs tend to prevent the occlusion of solder in the printed circuit board throughholes, these designs also have some performance drawbacks which, up to this point, have not been addressed.

The C-shaped solder pad design of U.S. Pat. No. 4,851,614 is an asymmetric design with a preferred orientation. As stated in column 3, lines 24–26 of the '614 patent, the pad "is substantially C-shaped with the open portion oriented such that it is the first portion contacted by the solder when the board is wave soldered."

It has been discovered that the thickness of the solder adhering to the C-shaped solder pad varies if the orientation of the C-shaped solder pad design deviates from the preferred orientation, or from a predetermined orientation. In other words, the only way to ensure that variations in solder thickness will not occur is to make sure that every C-shaped solder pad surrounding every through-hole required to be non-occluding on every printed circuit board undergoing the wave soldering process is oriented with the opening in the "C" shape facing in the same direction. To ensure that every C-shaped solder pad is properly oriented adds time and expense to the design of the printed circuit board because of necessary coordination with manufacturing to predict the required orientation.

If all of the C-shaped solder pads are not properly oriented, then the variations in thickness that occur, while minor, can create problems in certain applications due to the precise tolerance requirements necessary when developing printed circuit boards for certain uses, such as in portable computers.

These variations in thickness raise other concerns as well. For example, when mounting the printed circuit board to a computer system chassis, a mounting bolt is inserted through the through-hole of the printed circuit board and is then tightened into a corresponding bolt hole on the chassis. As the mounting bolt is tightened, a lower surface of a mounting bolt head begins exerting pressure on the printed circuit board in the region of the through-hole, as well as on the solder pad located on the lower surface of the printed circuit board which comes into contact with the computer chassis. The thickness of the solder which comprises the solder pad is uneven around the through-hole and causes the uneven application of pressure around the through-hole by the tightening of the mounting bolt, and such uneven strain placed on the printed circuit board when the mounting bolt is tightened can result in the delamination of the printed circuit board in the region of the through-hole, as well as the separation of the solder pad or underlying copper from the surface of the printed circuit board. Also, these thickness variations contribute to mechanical dimensional tolerances, which may lead to the misalignment of circuit components on the printed circuit board to associated mechanical components on the computer chassis.

Even if there are no variations in thickness of the solder, which assumes proper orientation of the solder pads, the asymmetric design of the C-shaped solder pad inherently leads to the possibility of uneven pressures being applied to the printed circuit board around the through-hole by the tightening of the mounting bolt. Since solder attaches only to the unmasked exposed C-shaped portion of the copper plated ring, while the gap or opening which defines the "C" shape remains free of solder, there is inherently an uneven distribution of solder about the through-hole due to the asymmetry of the solder pad design. This uneven distribution of solder can create the same problems of delamination and separation as discussed above.

As mentioned previously, the use of the spoked solder pad is known in the art, although applicant does not know whether the spoked solder pad design was implemented as a solution to the problems arising from the C-shaped solder pad design of the prior art, as discussed above. Regardless, the spoked solder pad designs of the prior art also have drawbacks which, to this point, have not been addressed.

By implementing the spoked solder pad design, the problems of orientation are no longer a concern, since a symmetric design does not have a preferred orientation, and the direction of travel over a wave solder does not matter. In other words, a symmetric design is omni-directional.

However, the spoked solder pad design has a smaller contact area of solder between the printed circuit board and the computer chassis than the C-shaped solder pad design (as shown in comparison in FIG. 1a and FIG. 1b). The contact area of solder between the printed circuit board and the computer chassis via the solder pad serves the important function of providing an electrical connection between the logical ground of the circuit on the printed circuit board and the electrical ground of the computer chassis.

Due to the minimal contact area of the spoked solder pad design, certain drawbacks exist. In certain situations, if the contact area of solder on the solder pad between the printed circuit board and the chassis is insufficient to create a proper grounding connection, then the improper grounding which results can cause computer system errors.

Because of certain regulatory requirements regarding electro-magnetic interference (EMI) and radio frequency interference (RFI), proper grounding is imperative. For example, high frequency radio frequency (RF) energy must be adequately returned to the chassis electrical ground to prevent excessive radiation from the unit. This is in order to comply with specified emission levels (measured in decibels or dB) set by regulatory agencies. The total contact area between the exposed conductive area of the solder pad and the computer chassis is key to effectively maximizing the conduction of the RF energy to electrical ground, thereby contributing to the reduction of the associated dB levels at various frequencies. Analysis of the C-shaped solder pad design versus the spoked solder pad design shows that the total surface area of the C-shaped solder pad design that comes into contact with the computer chassis is significantly different than that of the spoked solder pad design.

While the solder pad designs of the prior art do provide workable solutions to the problem of solder occlusion, the C-shaped solder pad design has variations-in-thickness problems resulting from variations in the orientation of the solder pad. Moreover, the spoked solder pad design has insufficient contact area problems which can result in an improper grounding connection.

In other words, the C-shaped solder pad design provides sufficient contact area between the solder pad on the lower surface of the printed circuit board and the computer chassis to provide for proper grounding with the chassis. However, the varying orientation of the asymmetric C-shaped solder pad design as it is passed through the wave solder creates variations in the thickness of the solder on the solder pad.

On the other hand, while the spoked design does not have this orientation problem, it does have a drawback in that there is insufficient contact area between the solder pad on the lower surface of the printed circuit board and the computer chassis to provide for a proper grounding connection. Therefore, a solution is needed that addresses all of the problems which currently exist in the prior art.

SUMMARY OF THE INVENTION

The omni-directional non-occluding solder pad of the present invention has a novel configuration which solves the problems of the prior art mentioned above, as well as the problem of solder occlusion in the through-hole.

The solder pad of the present invention is a symmetrical design which is omni-directional, and therefore does not create variations in thickness of solder as a result of variations in the orientation of the solder pad as it travels over the wave solder. Thus, this design permits the even distribution of mounting forces around the through-hole by providing a level solder pad surface around the perimeter of the mounting hole.

The solder pad of the present invention comprises a plurality of spokes displaced from the through-hole in an outwardly radiating direction. The novel configuration further comprises a circular ring which is concentric to the through-hole and intersects the plurality of spokes. This additional ring structure provides for additional contact area of solder between the printed circuit board and the computer chassis thereby increasing the probability of a proper grounding connection, and decreasing the probability of a computer system error resulting from an insufficient contact area of solder. The contact area can be varied to suit the particular application by changing the width of the solder pad ring and-/or spokes.

Accordingly, it is an object of the present invention to provide an improved solder pad design.

It is a further object of the present invention to provide an omni-directional non-occluding solder pad design.

An additional object of the present invention is to provide an omni-directional non-occluding solder pad design for through-holes on printed circuit boards.

Another object of the present invention is to provide an omni-directional non-occluding solder pad design that is always properly oriented, and provides a sufficient contact area of solder between a printed circuit board and a computer chassis for a proper grounding connection.

Yet another object of the present invention is to provide an omni-directional non-occluding solder pad design that allows for even mounting pressures to be applied to a printed circuit board in the region of a through-hole, thereby mitigating delamination and separation problems, as well as mechanical alignment problems.

Further objects and advantages of the present invention will become apparent from a consideration of the drawings and ensuing description.

DESCRIPTION OF THE DRAWINGS

FIG. 2a is a perspective view of a portion of a printed circuit board and a portion of a computer chassis. A through-hole on the printed circuit board is shown in a cutaway view.

FIG. 2b is a view of the through-hole, shown from the point-of-view of the computer chassis, looking up at a lower layer of the printed circuit board. The through-hole has an improved omni-directional non-occluding solder pad design surrounding it on the lower layer of the printed circuit board. Typically, the solder pad design is only needed on the wave solder side of the printed circuit board, which is usually the lower layer of the printed circuit board that ultimately contacts the computer chassis.

This configuration is known in the prior art, and the term "copper plated" is understood by those of ordinary skill in the art to refer to either bare copper or copper with additional plating or protective coating. The protective coating can be a non-metallic chemical coating used to temporarily protect the bare copper from oxidation before use. This protective coating is typically removed during the manufacturing process.

Figure 4A:
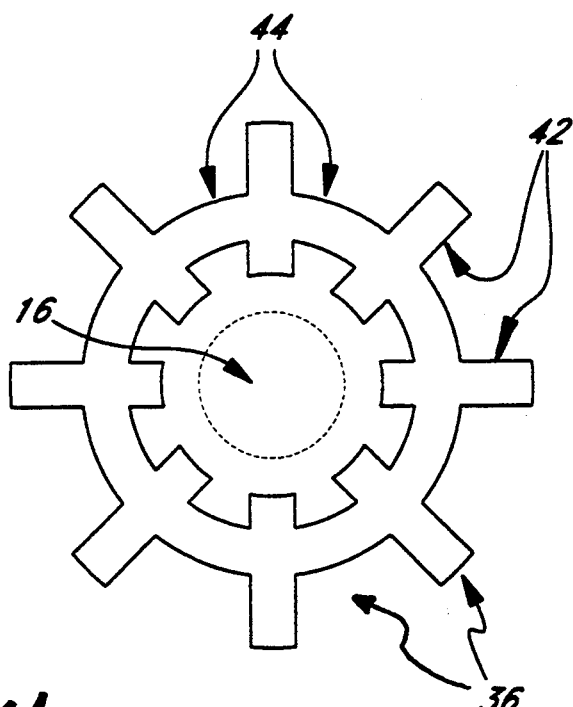

FIG. 4a is an illustration of the solder mask clearance design.

Figure 4B:
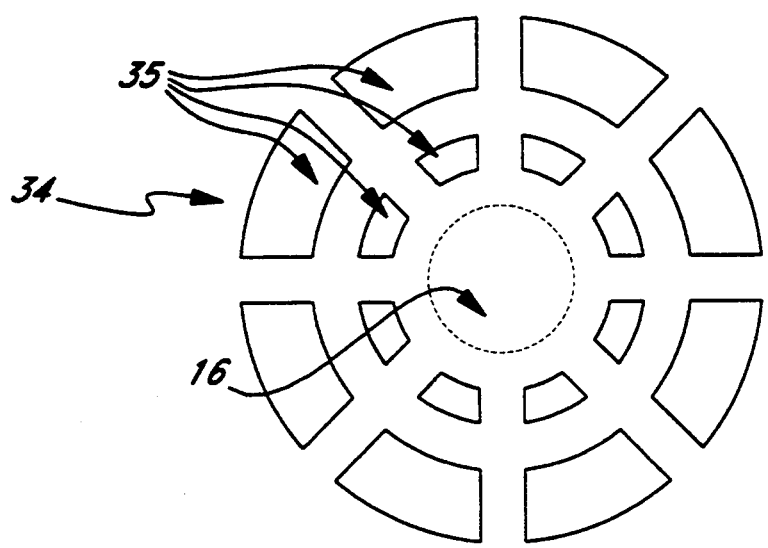

FIG. 4b is an illustration of a solder mask design which overlays the lower layer copper plated ring and allows specific areas of the copper plated ring, in the shape of a solder mask clearance design (as shown in FIG. 4a), to remain exposed to the wave soldering process, whereby the solder attaches to the unmasked portions.

Figure 3:
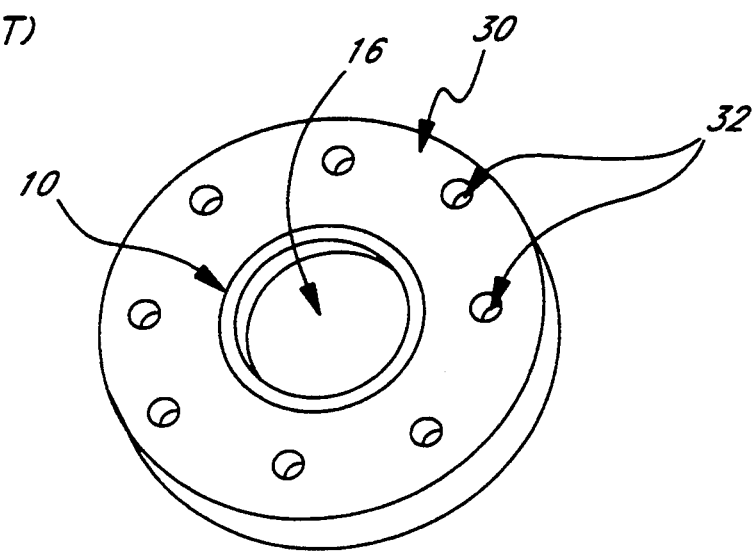
FIG. 3 is a perspective view of a non-plated through-hole surrounded by a copper plated ring. The copper plated ring is placed on both the upper layer and the lower layer of the printed circuit board, and is displaced from the outer edge of the through-hole. The upper layer and the lower layer copper plated rings are electrically interconnected by copper plated via holes.
Figure 5:
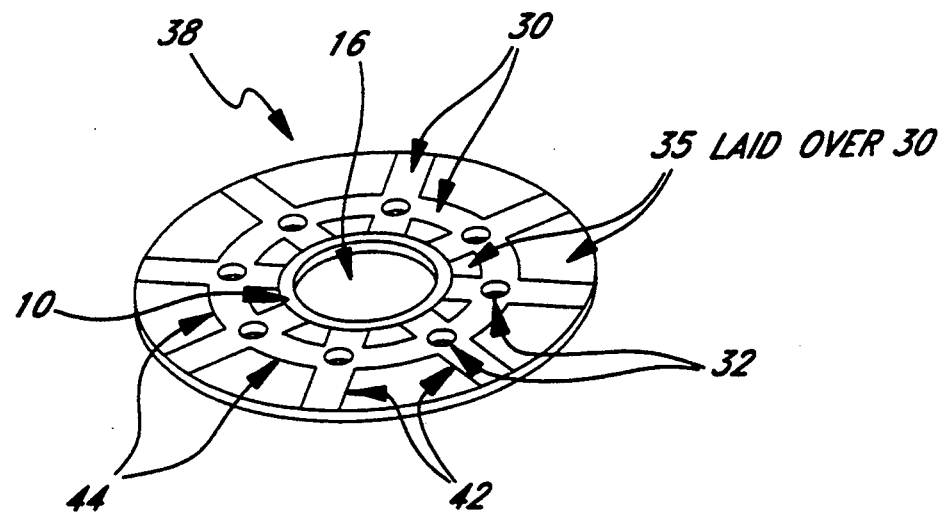

FIG. 5 is a perspective view of the solder mask design overlaid onto the structure of FIG. 3, whereby the exposed portions of the copper plated ring is in the shape of the solder mask clearance design of FIG. 4a.

Figure 6:
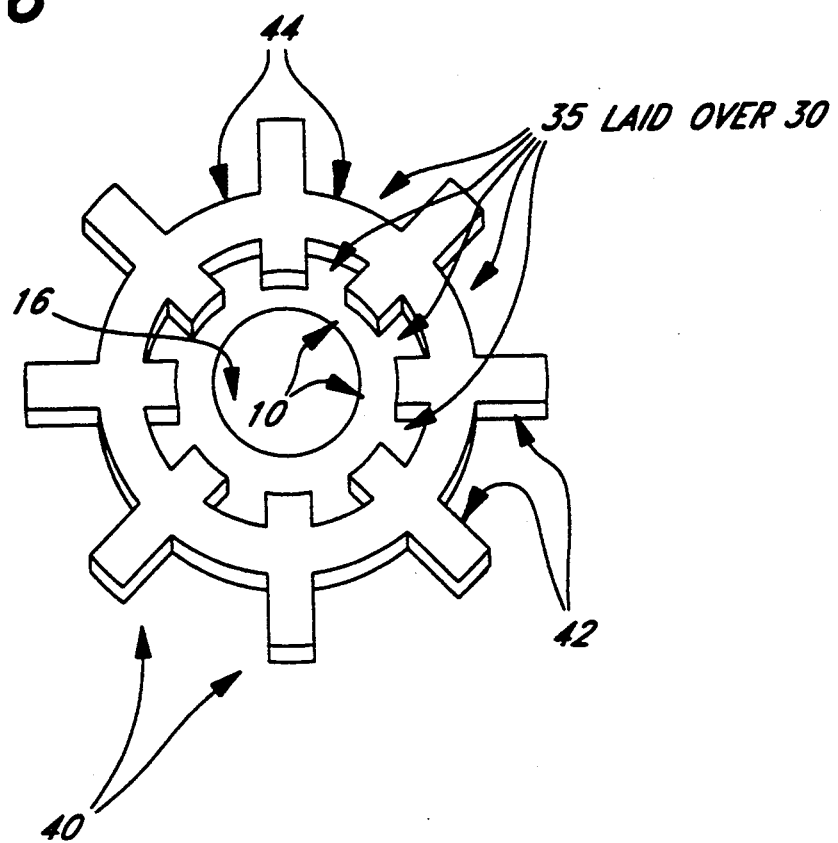

FIG. 6 is a top view of the solder pad around the through-hole, as it appears after being wave soldered.

DETAILED DESCRIPTION OF A PREFERRED EMBODIMENT

Figure 1A:
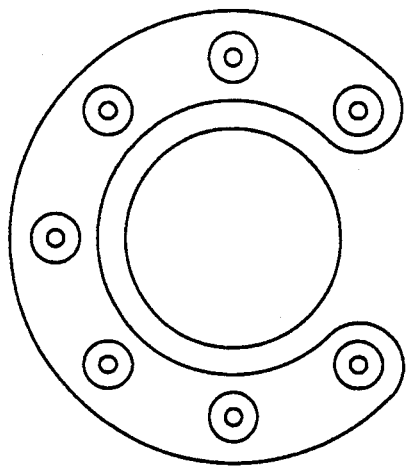
FIG. 1a is an illustration of a C-shaped solder pad of the prior art surrounding a through-hole.
Figure 1B:
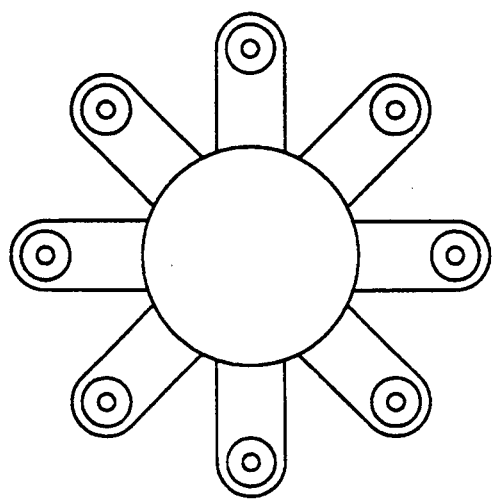
FIG. 1b is an illustration of a spoked solder pad of the prior art surrounding a through-hole.

FIG. 1a shows a C-shaped solder pad design and FIG. 1b shows a spoked solder pad design, both of which are known in the prior art.

FIG. 2a shows a portion of a printed circuit board 10 and a portion of a computer chassis 12. The printed circuit board 10 comprises circuit components 14, and at least one non-plated through-hole 16 which can be used as a mounting hole, also known as a chassis ground mounting hole.

FIG. 2b shows a lower layer 26 side of the through-hole 16 shown from the bottom of the printed circuit board 10, or from the point-of-view of the computer chassis 12 looking up at the bottom of the printed circuit board 10. A solder pad 40 is shown located around the through-hole 16 on the lower layer 26 of the printed circuit board 10. The process for placing the solder pad 40 around the through-hole 16 is discussed in further detail below.

Referring now to FIG. 2a and 2b, the printed circuit board 10 is typically mounted to the computer chassis 12 by inserting a mounting bolt 18 through the through-hole 16 of the printed circuit board 10, and then tightening the mounting bolt 18 into a corresponding bolt hole 22 on the computer chassis 12. As the mounting bolt 18 is tightened, a lower surface 19 of a mounting bolt head 20 begins exerting pressure on the printed circuit board 10, as well as a copper plated ring 30 (shown in FIG. 3) on an upper layer 24, and the solder pad 40 on the lower layer 26 of the printed circuit board 10 around the through-hole 16.

FIG. 3 shows the non-plated through-hole 16 surrounded by the copper plated ring 30, with a plurality of copper plated via holes 32 through the printed circuit board 10 at the location of the copper plated ring 30. The copper plated ring 30 is placed on both the upper layer 24 and the lower layer 26 of the printed circuit board 10 and is displaced from the outer edge of the through-hole 16. The upper layer 24 copper plated ring 30 and the lower layer 26 copper plated ring 30 are electrically interconnected by copper plated via holes 32. This configuration is known in the prior art.

FIG. 4a shows a solder mask clearance design 36 comprising a plurality of spokes 42 and a ring 44 concentric to the through-hole 16. The spokes 42 radiate outward from the through-hole 16 so as to intersect the ring 44 at approximately a perpendicular angle. The solder mask clearance design 36 represents the portions of the printed circuit board 10 (FIG. 1) that remain unmasked by a solder mask design 34 (shown in FIG. 4b). The solder mask clearance design 36 is used to indicated the shape that the solder pad 40 (FIG. 2b) will take after the wave soldering process, since the solder pad 40 adheres only to the unmasked portions of the printed circuit board 10.

FIG. 4b shows the solder mask design 34. This design is basically the inverse of the solder mask clearance design 36, since the solder mask design 34 indicates the portions of the printed circuit board 10 that will be masked, whereas the solder mask clearance design 36 indicates the portions of the printed circuit board 10 (FIG. 1) that will remain unmasked. The solder mask design 34 comprises a plurality of arcuate trapezoidally shaped segments 35 placed in a concentric pattern about the through-hole 16 such that the gaps between these segments 35 define the shape of the solder mask clearance design 36 (FIG. 4a), as well as the solder pad 40 (FIG. 2b).

The solder mask design 34 of FIG. 4b is overlaid on the copper plated ring 30 (FIG. 3) located on the lower layer 26 of the printed circuit board 10 such that passing the printed circuit board 10 over a wave solder results in the adherence of solder to the unmasked portions of the printed circuit board 10, which typically comprises portions of the copper plated ring 30 in the region of the through-hole 16 on the lower layer 26. These unmasked portions expose portions of the copper plated ring 30 in the shape of the solder mask clearance design 36, thereby generating the solder pad 40 of a similar shape when the printed circuit board 10 is passed over the wave solder.

In other words, the solder mask design 34 indicates the portions of the printed circuit board 10 that resist solder, whereas the solder mask clearance design 36 indicates the portions of the printed circuit board 10 where solder will adhere. Therefore, when the solder mask design 34 overlays the copper plated ring 30, thereby allowing the unmasked areas of the copper plated ring 30 to remain exposed to the wave solder, the solder attaches to those exposed copper portions of the copper plated ring 30 to form the solder pad 40 in the shape of the solder mask clearance design 36.

The resulting solder pad 40 comprises the plurality of spokes 42, and the ring 44 concentric to the through-hole 16. The spokes 42 radiate outward from the through-hole 16 so as to intersect the ring 44 at approximately a perpendicular angle. The copper plated via holes 32 fill with solder during the wave soldering process via capillary action in a manner understood by those of ordinary skill in the art. In a preferred embodiment, the copper plated via holes 32 are located at the intersections of the spokes 42 and the ring 44.

The solder mask design 34 is needed only on the lower layer 26 of the printed circuit board 10 to produce the solder pad 40 on the lower layer 26 which provides a contact area that serves as an electrical connection between the printed circuit board 10 and the computer chassis 12. The upper layer 24 of the printed circuit board 10 does not require the solder pad 40.

FIG. 5 shows the solder mask design 34 (FIG. 4b) comprising the segments 35 overlaid onto the copper plated ring 30. This is how the printed circuit board 10 appears before being passed over the wave solder. When the solder mask design 34 comprising the segments 35, the copper plated ring 30, and the copper plated via holes 32 (collectively hereinafter called a pad design 38), are passed over the wave solder, the pad design 38 allows the non-plated through-hole 16 to remain free of solder occlusion after traveling through the printed circuit board 10 circuit component 14 attachment step of the wave soldering process. During the wave soldering process, the solder adheres to the exposed copper areas of the copper plated ring 30 around the through-hole 16 in the shape of the solder mask clearance design 36.

FIG. 6 shows the solder pad 40 around the through-hole 16, as it appears after the wave soldering process. Note that the unmasked portions of the copper plated ring 30 (FIG. 5) now comprise the solder pad 40.

As a result of the symmetrical design of the resulting solder pad 40, there is no need for ensuring proper orientation of the solder pad 40 since the symmetric solder pad 40 is omni-directional. Furthermore, the addition of the ring 44 structure provides additional contact area of solder which serves as an electrical connection between the printed circuit board 10 and the computer chassis 12. This additional contact area provides sufficient electrical connection between the printed circuit board 10 and the computer chassis 12 to ensure a proper grounding connection.

While the above description contains many specificities, these should not be construed as limitations on the scope of the invention, but rather as an exemplification of one preferred embodiment thereof. Many other variations are possible. For example, the number of spokes 42 and the number of copper plated via holes 32 can be varied without significantly affecting the operation of the present invention. Furthermore, the location of the copper plated via holes 32 can be located in various positions on the spokes 42 or on the ring 44, and not necessarily at the intersections of the spokes 32 and the ring 44. In addition, the copper plated ring 30 and the copper plated via holes 32 can be plated with conductive materials other than copper that provide an electrical connection between the various layers of the printed circuit board 10. Also, the diameter of the copper plated via holes 32 can be varied such that, if the through-hole 16 were conductively plated, the total conductive area of the collective copper plated via holes 32 would be equal to or greater than the relative conductive area of the through-hole 16.

What is claimed is:

1. A printed circuit board having at least one through-hole and comprising
   a conductive ring disposed about and displaced from said through-hole through said printed circuit board,
   a plurality of conductively plated via holes passing through said printed circuit board at the location of said conductive ring, and
   a solder mask covering portions of said conductive ring adapted such that passing unmasked portions of said conductive ring over a wave solder creates a solder pad comprising a plurality of spokes radiating outward from said through-hole, said spokes intersecting a circular ring concentric to said through-hole at approximately a perpendicular angle.

2. The printed circuit board of claim 1, wherein said solder pad comprises eight spokes.

3. The printed circuit board of claim 1, wherein said solder pad comprises eight conductively plated via holes.

4. The printed circuit board of claim 1, wherein said conductively plated via holes are located at the intersection of said spokes and said circular ring.

5. The printed circuit board of claim 1, wherein said solder pad comprises four spokes.

6. The printed circuit board of claim 1, wherein said solder pad comprises four conductively plated via holes.

7. The printed circuit board of claim 1, wherein said conductively plated via holes are located on said spokes.

8. The printed circuit board of claim 1, wherein said conductively plated via holes are located on said circular ring.

9. A laminated printed circuit board having at least one through-hole comprising
   a plurality of conductor-containing layers,
   a solder pad surrounding said through-hole comprising a plurality of spokes radiating outward from said through-hole, said spokes intersecting a circular ring concentric to said through-hole at approximately a perpendicular angle,
   said solder pad being on an external layer of said printed circuit board disposed about said through-hole through said printed circuit board, and
   a plurality of via holes through said printed circuit board at the location of said solder pad, said via holes having a plated bore electrically interconnecting said solder pad with selected conductors on other layers of said printed circuit board.

10. A printed circuit board having at least one through-hole comprising
    a conductive ring surrounding said through-hole through said printed circuit board,
    a plurality of via holes through said conductive ring, and
    a solder mask covering portions of said conductive ring adapted such that passing unmasked portions of said conductive ring over a wave solder creates a solder pad comprising a plurality of spokes radiating outward from said through-hole, said spokes intersecting a circular ring concentric to said through-hole at approximately a perpendicular angle.

11. A method of manufacturing a printed circuit board having at least one through-hole surrounded by a conductive ring comprising the steps of:
    placing a solder mask on portions of said conductive ring,
    passing said printed circuit board over a wave solder, and
    adhering solder to unmasked portions of said conductive ring such that said solder forms a solder pad disposed about said through-hole through said printed circuit board with a plurality of via holes through said printed circuit board at the location of said solder pad, said solder pad comprising a plurality of spokes radiating outward from said through-hole, said spokes intersecting a circular ring concentric to said through-hole at approximately a perpendicular angle.

12. A printed circuit board having at least one through hole, an upper layer, and a lower layer, comprising
    a conductive ring on said upper layer of said printed circuit board,
    a solder pad located on said lower layer of said printed circuit board disposed about and displaced from said through-hole through said printed circuit board, said solder pad comprising a plurality of spokes radiating outward from said through-hole, said spokes intersecting a circular ring concentric to said through-hole at approximately a perpendicular angle, and
    a plurality of plated via holes electrically interconnecting said solder pad on said lower layer to said conductive ring on said upper layer of said printed circuit board.

13. A printed circuit board, having an upper layer and a lower layer, comprising
    at least one through-hole through said printed circuit board,
    a solder pad located on said lower layer of said printed circuit board disposed about and displaced from said through-hole through said printed circuit board,
    said solder pad comprising a plurality of spokes radiating outward from said through-hole, said spokes intersecting a circular ring concentric to said through-hole at approximately a perpendicular angle,
    a pad of conductive material on said upper layer of said printed circuit board disposed about and displaced from said through-hole through said printed circuit board, and a plurality of plated via holes passing through said solder pad and electrically interconnecting said solder pad on said lower layer to said pad of conductive material on said upper layer of said printed circuit board.

14. An electronic assembly comprising
an electrically conductive chassis,
a printed circuit board comprising at least one through-hole,
a solder pad disposed about and displaced from said through-hole through said printed circuit board, said solder pad comprising a plurality of spokes radiating outward from said through-hole, said spokes intersecting a circular ring concentric to said through-hole at approximately a perpendicular angle, and
a mounting bolt for attaching said printed circuit board to said chassis, said mounting bolt passing through said through-hole having said solder pad disposed about it, and electrically bonding said chassis to said solder pad.

* * * * *